(12) United States Patent
Vajana et al.

(10) Patent No.: US 6,380,034 B1
(45) Date of Patent: Apr. 30, 2002

(54) PROCESS FOR MANUFACTURING MEMORY CELLS WITH DIMENSIONAL CONTROL OF THE FLOATING GATE REGIONS

(75) Inventors: Bruno Vajana, Bergamo; Giovanna Dalla Libera, Monza, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/619,861

(22) Filed: Jul. 20, 2000

(30) Foreign Application Priority Data

Jul. 22, 1999 (EP) .............................. 99830470

(51) Int. Cl.⁷ .......................................... H01L 21/8247
(52) U.S. Cl. ...................................... 438/258; 438/594
(58) Field of Search ................................ 438/257–267, 438/593–594

(56) References Cited

U.S. PATENT DOCUMENTS

| | | | |
|---|---|---|---|
| 4,608,585 A | 8/1986 | Keshtbod | 357/23.5 |
| 4,794,562 A | 12/1988 | Kato et al. | 365/182 |
| 5,273,926 A | 12/1993 | Tigelaar | 437/52 |
| 5,496,754 A | * 3/1996 | Bergemont et al. | |
| 5,702,966 A | * 12/1997 | Noda et al. | |
| 5,837,583 A | * 11/1998 | Chuang et al. | 438/257 |
| 5,925,907 A | 7/1999 | Hazama | 257/315 |
| 6,194,270 B1 | * 2/2001 | Bottini et al. | 438/258 |

FOREIGN PATENT DOCUMENTS

| | | |
|---|---|---|
| EP | 0 256 993 A1 | 2/1988 |
| EP | 0 299 853 A1 | 1/1989 |
| EP | 0 612 107 A1 | 8/1994 |
| EP | 0 613 176 A1 | 8/1994 |
| EP | 0 655 785 A2 | 5/1995 |

* cited by examiner

*Primary Examiner*—Richard Booth
(74) *Attorney, Agent, or Firm*—Lisa K. Jorgenson; E. Rusell Tarleton; Seed IP Law Group PLLC

(57) ABSTRACT

A manufacturing process including: forming a substrate and insulating layer including a tunnel area; and simultaneously forming a floating gate region of a memory transistor and a lower gate portion of a selection transistor, the floating gate region internally forming a hole, one side of which delimits, together with an external side of the floating gate region, a portion of tunnel arranged above the tunnel area; a dielectric material layer is then deposited, and fills the hole of the floating gate region; the structure is planarized by CMP, and an insulating region of dielectric material is formed; and a control gate region is formed above the floating gate region and simultaneously an upper gate portion is formed above the lower gate portion. The upper and lower gate portions form a control gate region of the selection transistor. In this way, the upper gate portion and the control gate region are substantially on the same level.

19 Claims, 7 Drawing Sheets

US 6,380,034 B1

PROCESS FOR MANUFACTURING MEMORY CELLS WITH DIMENSIONAL CONTROL OF THE FLOATING GATE REGIONS

TECHNICAL FIELD

The present invention regards a process for manufacturing an electronic device comprising nonvolatile memory cells with dimensional control of the floating gate regions.

BACKGROUND OF THE INVENTION

Devices using nonvolatile memories of the EEPROM type, such as smart cards, complex microcontrollers and mass storage devices, which require programmability of the individual byte, call for increasingly higher levels of performance and reliability.

In practice, from the technological standpoint, it is necessary to get high levels of performance (i.e., increasingly thinner tunnel oxides, ever more reduced programming voltages, increasingly greater cell current driving capability, etc.) to coexist with high reliability. One hundred thousand programming cycles and retention of the charge stored for at least ten years are by now considered the minimum requisites for the acceptance of this type of product on the market.

On the basis of the above, new manufacturing processes and new geometries are needed that are able to eliminate some of the critical aspects typical of memories, thus increasing their intrinsic reliability without reducing their performance, both for "embedded" applications (i.e., when the memory cells are associated to special electronic devices) and for stand alone applications (i.e., when the device is merely a nonvolatile memory).

In particular, European Patent Application No. 99830347.3 filed on Apr. 6, 1999 describes a process for manufacturing a memory cell wherein the floating gate mask has an opening with an internal delimiting side extending at a preset distance from a corresponding external delimiting side, so that the floating gate region forms internally a hole, and the tunnel area is defined in length by the floating gate mask alone. The hole is filled with a dielectric material layer; then, the surface of the floating gate region is planarized, and an insulating region of dielectric material is formed.

Next, a second polycrystalline silicon layer (poly2) is deposited and shaped so as to form a control gate region and, at the same time, a selection transistor gate region. Finally, conductive regions are formed in the active area.

This process is advantageous in that a precise dimensional control of the tunnel region may be obtained. However, it poses the problem that the height difference during the definition of structures belonging to the same layer, such as the control gate of the memory transistor and the gate region of the selection transistor, requires critical and sophisticated etching processes to eliminate possible residual material that occurs in complex geometries.

SUMMARY OF THE INVENTION

The disclosed embodiments of the present invention provide a manufacturing process that enables elimination of the critical aspects when defining a second polysilicon layer.

According to embodiments of the present invention, a process for manufacturing an electronic device comprising EEPROM memory cells, and the thus obtained electronic device, are provided. The process includes forming a first dielectric material layer on top of a semiconductor material substrate that includes a tunnel area; simultaneously forming a floating gate region on top of the first dielectric material layer to partially overlie the tunnel region and forming a lower gate portion on top of the first dielectric material layer in a position adjacent to and at a distance from the floating gate region, which includes the steps of depositing a first semiconductor material layer above the first dielectric material layer and the tunnel area and selectively removing the first semiconductor material layer externally to the floating gate region and the lower gate portion and inside the floating gate region to form a hole therein; forming an insulating structure surrounding the floating gate region, including coating the hole with an insulating material; simultaneously forming a control gate region on top of the insulating structure and an upper gate portion on top of the lower gate portion; and forming conductive regions in the semiconductor material substrate.

BRIEF DESCRIPTION OF THE DRAWINGS

For an understanding of the present invention, a preferred embodiment thereof will now be described, simply as a non-limiting example, with reference to the attached drawings, wherein.

DETAILED DESCRIPTION OF THE INVENTION

The ensuing description regards an embodiment of EEPROM memory cells comprising a selection transistor and a memory transistor.

The EEPROM memory cells form a memory array and are formed in a wafer 1 of monocrystalline silicon, and, more precisely, in a part of the wafer 1, hereinafter also referred to as "array area 15". The wafer 1 moreover houses circuitry components (transistors, resistors, capacitors, and diodes) not shown, in a circuitry area of the wafer 1, the circuitry area not being shown either.

Figure 1:
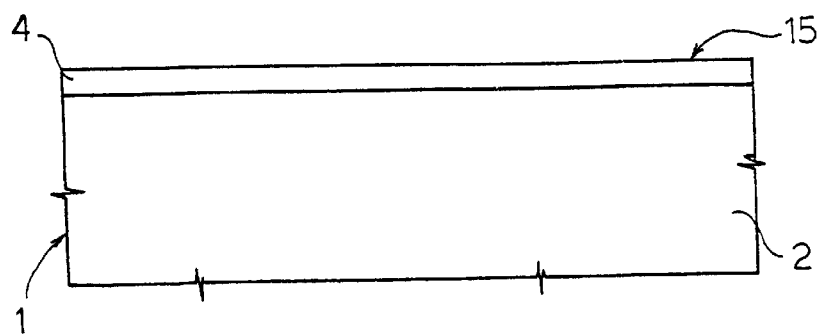
FIG. 1 shows a cross-section through a silicon wafer in an initial step of the manufacturing process according to the invention.

In FIG. 1, the wafer 1 comprises a monocrystalline silicon substrate 2, here of P-type, and has undergone the steps for defining the active areas. In detail, with the surface 3 of the substrate 2 covered by an active area mask 4 of non-oxidizable material (typically, of a double layer of silicon oxide and silicon nitride defined using a resist mask), the wafer 1 has been thermally oxidized. Consequently, in the parts of the substrate 2 not covered by the active area mask 4, a thick oxide is grown (field oxide 5 in FIG. 2), which delimits, between these parts of the substrate, active areas of the substrate that are designed to house the various components of the device to be formed. In particular, in FIG. 1, an array active area 15 is shown, which is designed to house an EEPROM memory cell.

Figure 2:
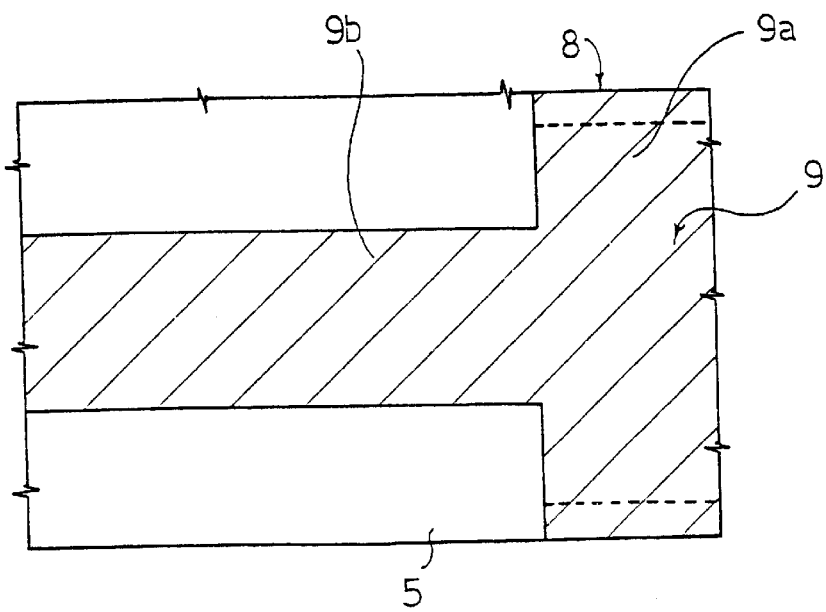
FIG. 2 presents a top view of the wafer of FIG. 1.

In detail and in a per se known manner, the array active area 15 defines a grid, of which FIG. 2 shows in a complete way only the part regarding a cell, designated by 9, having basically the shape of a T rotated through 90° and comprising a leg 9a and a crosspiece 9b. The leg 9a is contiguous and electrically connected to corresponding legs 9a of other cells set on top of and beneath the shown cell, of which only parts are illustrated. In addition, the leg 9a is joined to a leg of an adjacent cell on the right (not shown) having a symmetrical structure with respect to the shown cell. The crosspiece 9b is contiguous and electrically connected to a crosspiece of an adjacent cell on the left (not shown) having a symmetrical structure with respect to the shown cell. The legs 9a are designed to house source regions of the memory transistors. The ends of the crosspieces 9a not connected to the legs 9a are designed to house drain regions of the selection transistors, and gate regions of the cells are to be formed on the crosspieces 9b. Further active areas are generally provided for making LV or HV PMOS and NMOS transistors, these areas not being shown in the drawings.

Figure 3:
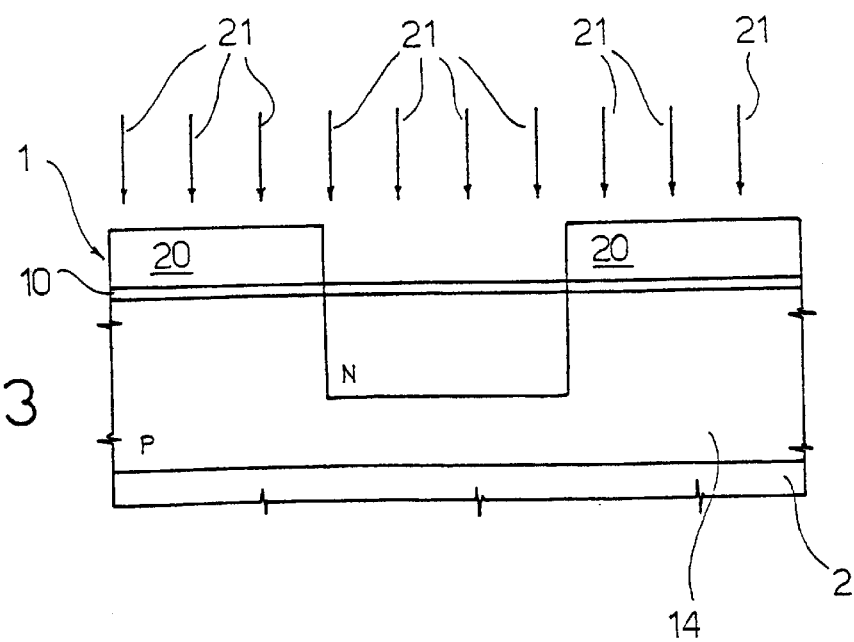
FIG. 3 shows a cross-sectional view similar to that of FIG. 1, in a subsequent manufacturing step.
Figure 4:
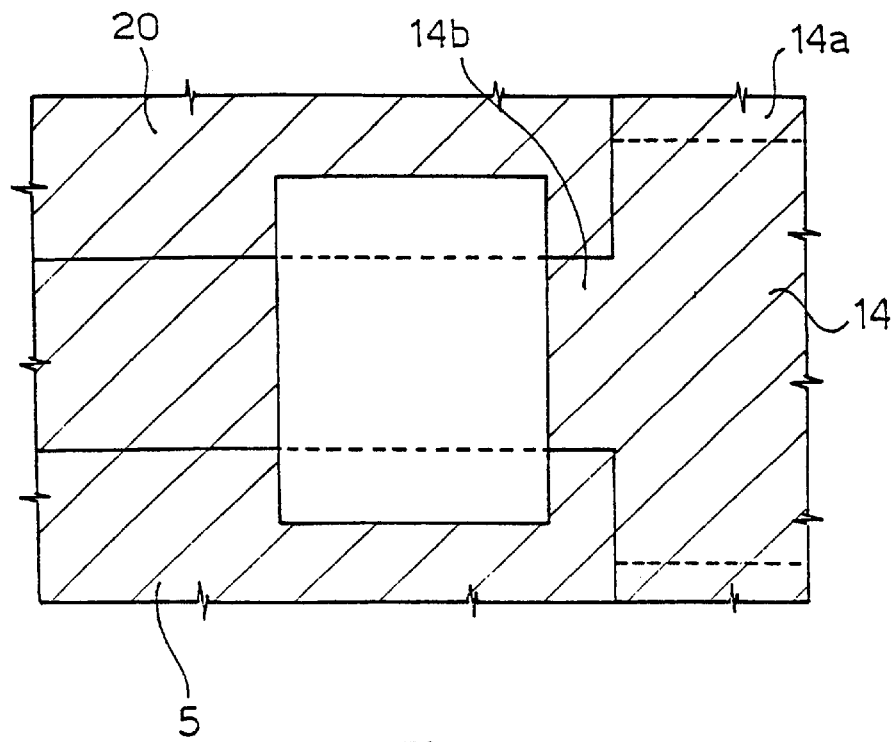
FIG. 4 presents a top view of the wafer of FIG. 3.

Subsequently, the active area mask 4 is removed, and the free surface 3 of the substrate is oxidized to form a sacrificial oxide layer 10. Next, using a resist mask (not shown) that covers the entire surface of the wafer 1 except for the array active areas 8, P-type doping ion species are implanted. A P-matrix region 14 is thus formed in the substrate 2, as shown in FIG. 3. P-matrix regions 14 reproduce exactly the shape of the respective array active areas 8, and hence, for each cell, a leg 14a (corresponding to the leg 9a of the active area of a cell 9, see FIG. 4) and a crosspiece 14b (corresponding to the crosspiece 9b, see FIG. 4) may be identified.

Figure 5:
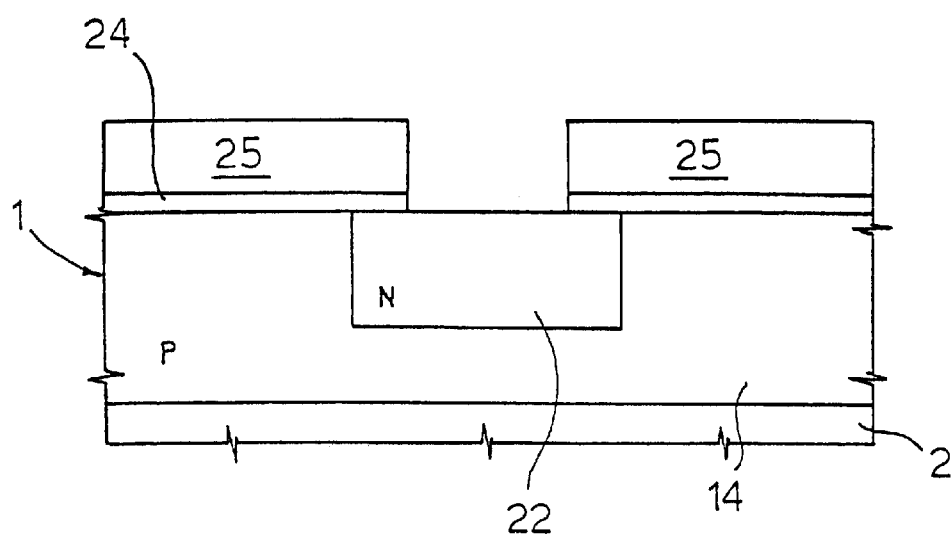
FIG. 5 shows a cross-sectional view similar to that of FIG. 1, in a subsequent manufacturing step.

Next, a capacitor mask 20 is formed which covers the entire surface of the wafer 1, except for rectangles perpendicular to the crosspieces 14b. N-type doping species (e.g., phosphorous) are then implanted, as represented in FIG. 3 by arrows 21. Thus, N-type continuity regions 22 are formed in the crosspieces 14b (as shown in FIG. 5), as necessary for electrical continuity between each selection transistor and the corresponding memory transistor of each cell.

After removal of the capacitor mask, the wafer 1 is annealed, the sacrificial oxide layer 10 is removed, and a gate oxidation is carried out, thus forming a gate oxide layer 24 over the entire surface of the P-matrix region 14. The dimensions of the gate oxide layer 24 can be calibrated in a known way.

Subsequently, a tunnel mask 25 is formed, which is shown in cross-sectional view in FIG. 5 and in top view in FIG. 6, the tunnel mask covering the entire surface of the wafer 1, except for a portion perpendicular to the crosspieces 14b and partly overlapping the continuity regions 22.

Figure 6:
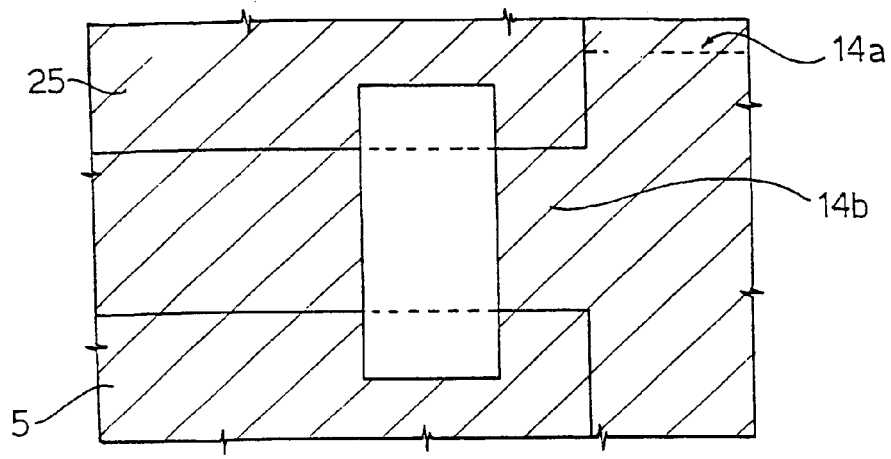
FIG. 6 presents a top view of the wafer of FIG. 5.
Figure 7:
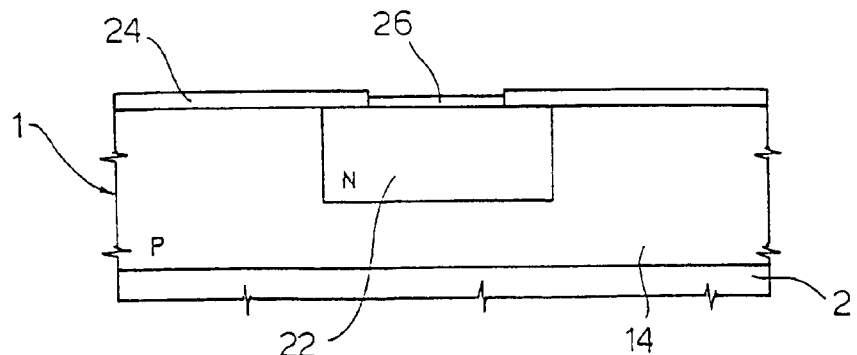
FIGS. 7 and 8 show cross-sectional views similar to that of FIG. 5, in subsequent manufacturing steps.

The gate oxide layer 24 is removed, and a tunnel oxide region 26 is then grown, and covers the regions without gate oxide 24, as shown in FIG. 6.

Figure 8:
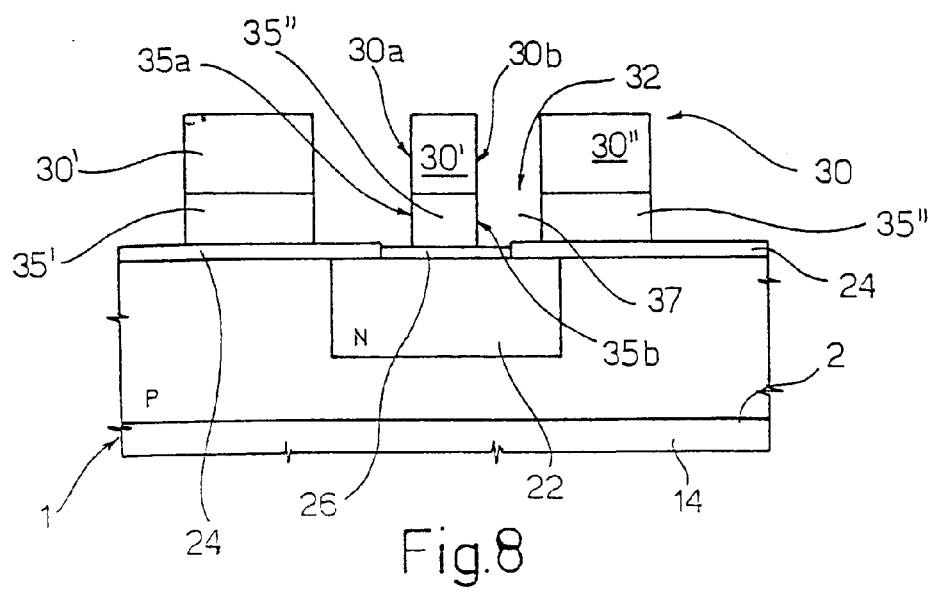
Figure 9:
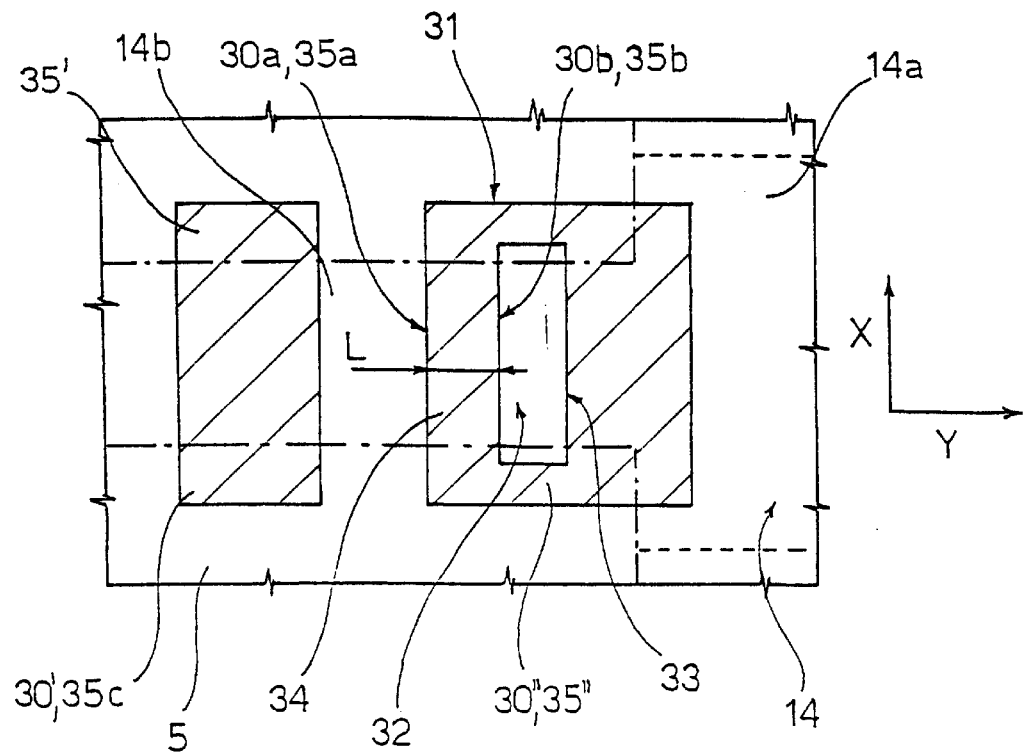
FIG. 9 presents a top view of the wafer of FIG. 8.

Next, a first polycrystalline silicon layer(polyl layer 35) is deposited, suitably doped and defined using a floating gate mask 30, shown in cross-sectional view in FIG. 8 and in top view in FIG. 9. The floating gate mask 30 comprises a first mask region 30', where the gate regions of the selection transistors are to be formed, and a second mask region 30", where the floating gates of the memory transistors are to be formed.

The second mask region 30" has an external perimetral edge 31 of a rectangular shape, one side 30a of which extends perpendicularly to the crosspiece 14b (parallel to the x axis in FIG. 9), in a position approximately central with respect to the crosspiece 14b itself. The second mask region 30" further has an opening 32 delimited by an internal perimetral edge 33. The internal perimetral edge 33 also has a rectangular shape with sides parallel to the sides of the external perimetral edge 31. In particular, one side 30b of the internal perimetral edge 33 facing the side 30a delimits, together with the side 30a, a mask portion 34 having a preset length L (y direction in FIG. 9 corresponding to the width desired for the tunnel area). The position of the floating gate mask 30 and the size of the tunnel oxide region 26 are chosen so that the edges 30a and 30b of the mask portion 34 are inside the tunnel oxide region 26 also in case of misalignments. Preferably, the opening 32 has a width of 0.5 $\mu$m (for a process at 0.35 $\mu$m).

Subsequently (FIGS. 8 and 9), the polyl layer 35 is etched. Given the shape of the floating gate mask 30, the polyl layer 35 forms, beneath the first mask region 30', a lower gate portion 35', and, beneath the second mask region 30", a floating gate region 35", which has the same shape as the second mask region 30", with a hole 37 beneath the opening 32. In particular, the sides of the floating gate region 35" corresponding to the external delimiting edge 30a and internal delimiting edge 30b, designated by 35a and 35b, define the length of the tunnel in the y direction, determined solely by the dimensions of the floating gate mask 30, namely by the length L of the mask portion 34.

The dimension of the tunnel area in the perpendicular direction (x direction in FIG. 9) is instead determined by the width of the crosspiece 14b of the P-matrix region 14 (active area of the cell).

Figure 10:
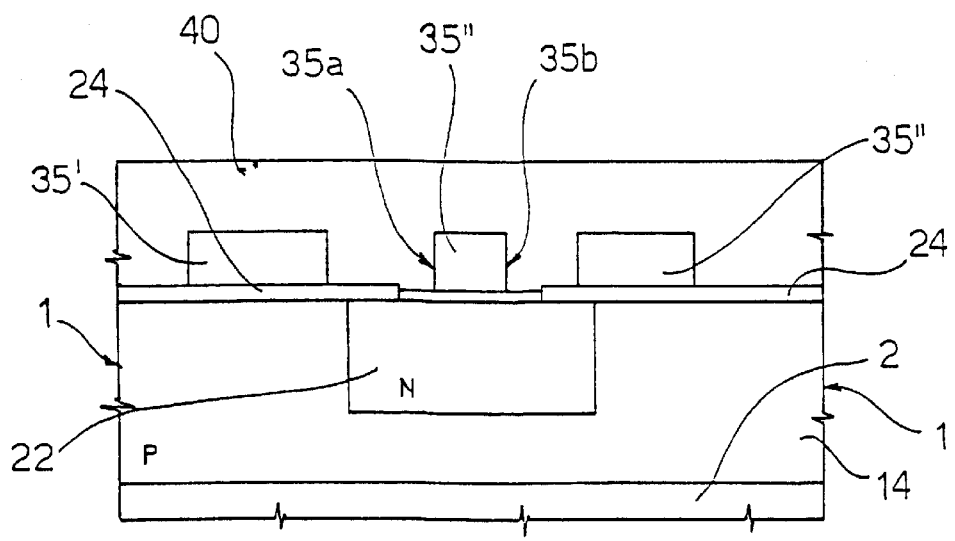
FIGS. 10–12 show cross-sectional views similar to those of FIG. 8, in subsequent manufacturing steps.

Subsequently (FIG. 10), over the entire surface of the wafer 1, a dielectric material layer 40 is deposited, for example, of TetraEthylOrthoSilicate (TEOS) or silicon oxide deposited at low temperatures. The dielectric material layer 40, which has a greater thickness than the polyl layer 35, fills the hole 37, where it forms a filling region 43 (FIG. 11).

Then, using a dielectric mask (not illustrated), which entirely covers the array area 15 and leaves the circuitry area (not shown) uncovered, the dielectric material layer 40 is removed from the circuitry area.

Then a planarization step is carried out, using the chemical-mechanical planarization (CMP) technique, which removes the dielectric material layer 40 from the entire surface of the wafer 1 as far as the floating gate region 35" and the lower gate portion 35'. The dielectric material layer 40 remains in the hole 37 of the floating gate region 35", where it forms a filling region 43, as shown in FIG. 11.

Figure 11:
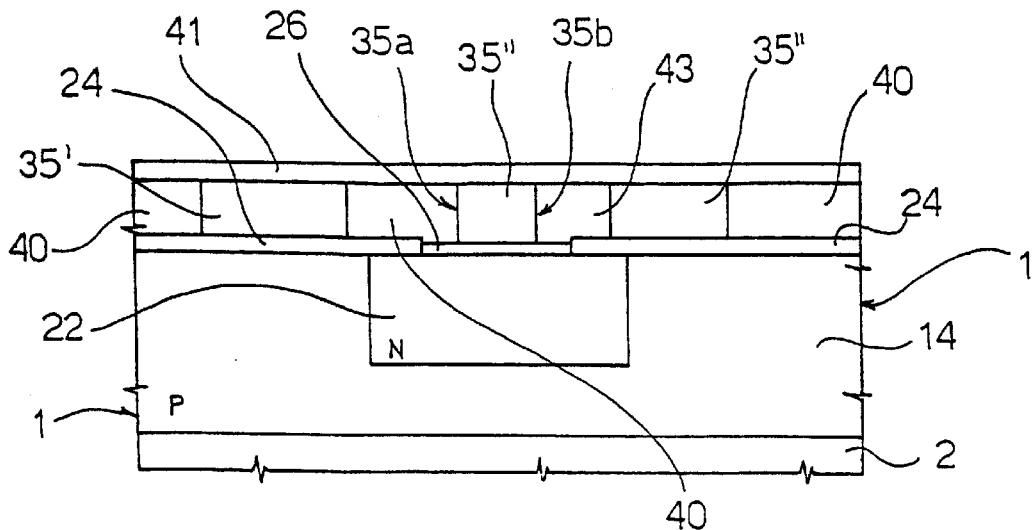
Figure 12:
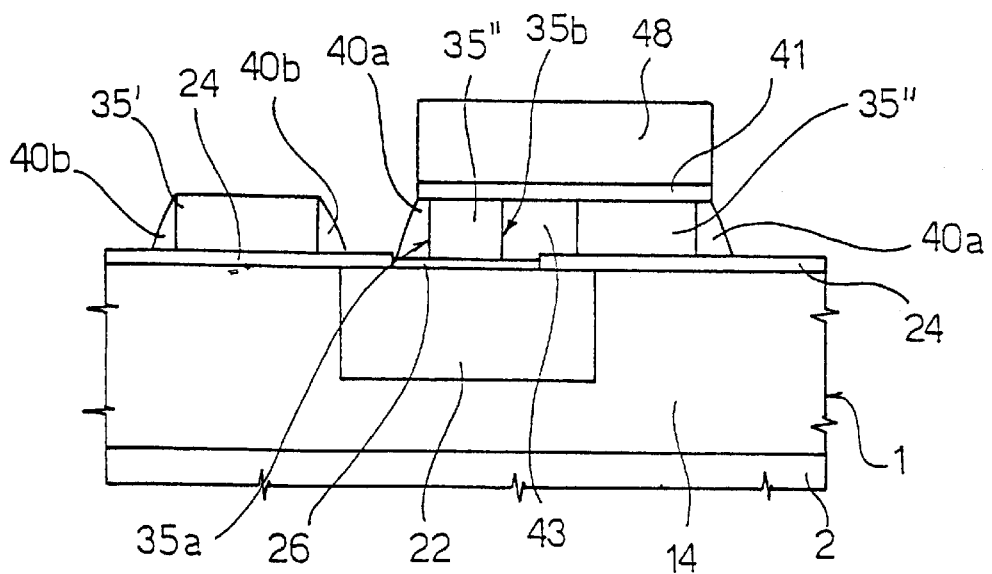
Figure 13:
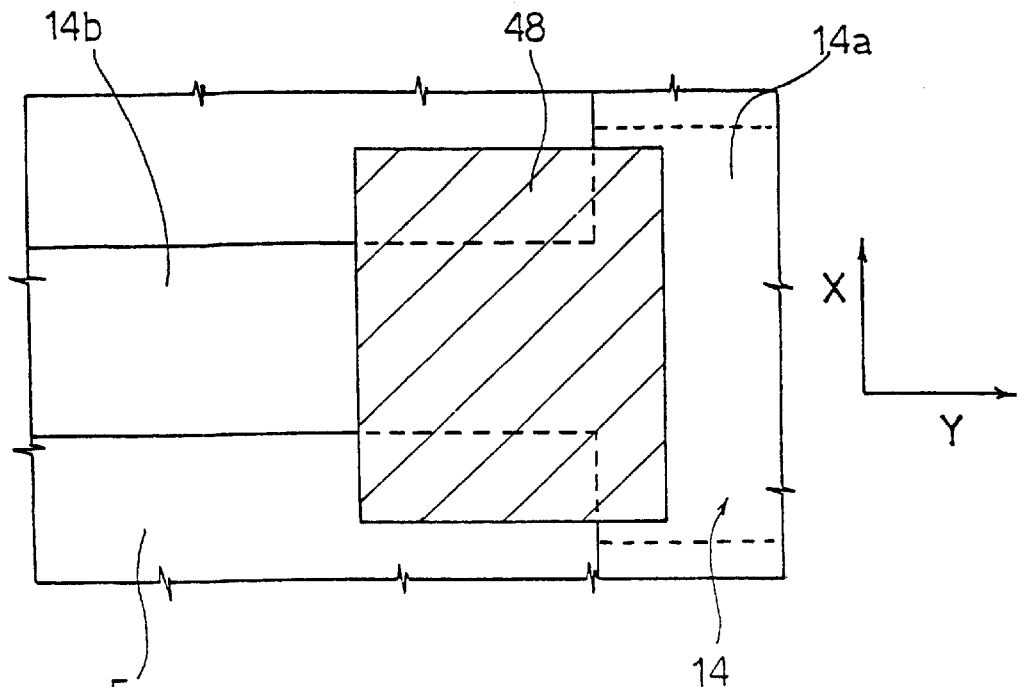
FIG. 13 presents a top view of the wafer of FIG. 12.

Subsequently, an interpoly dielectric layer 41 is formed, for example comprising a triple layer of silicon oxide-silicon nitride-silicon oxide (ONO), as shown in FIG. 11. Next, using an ONO mask 48 (shown in FIGS. 12 and 13), which is larger than the floating gate region 30", and performing an anisotropic etch, first the interpoly dielectric layer 41 is selectively removed and remains only over the floating gate region 35", and then the dielectric material layer 40 is removed, which, given the etch anisotropy, remains only at the sides of the floating gate region 35" (where it forms lateral insulation regions 40a, which, together with the remaining portion of the interpoly dielectric layer 41, externally seals the floating gate region 35"), at the sides of the lower gate portion 35' (where it forms lateral insulation regions 40b), and in the hole 37 of the floating gate region 35".

Subsequently, a second polycrystalline silicon layer is deposited and shaped using a control gate mask 56 shown in cross-sectional view in FIG. 14 and in top view in FIG. 15, so forming a control gate region 50a on top of the floating gate region 35" and an upper gate portion 50b on top of the lower gate portion 35' of the selection transistor. The control gate region 50a has an area smaller than that occupied by the floating gate region 35" (including the hole 37), and hence the cell is not self-aligned.

Figure 14:
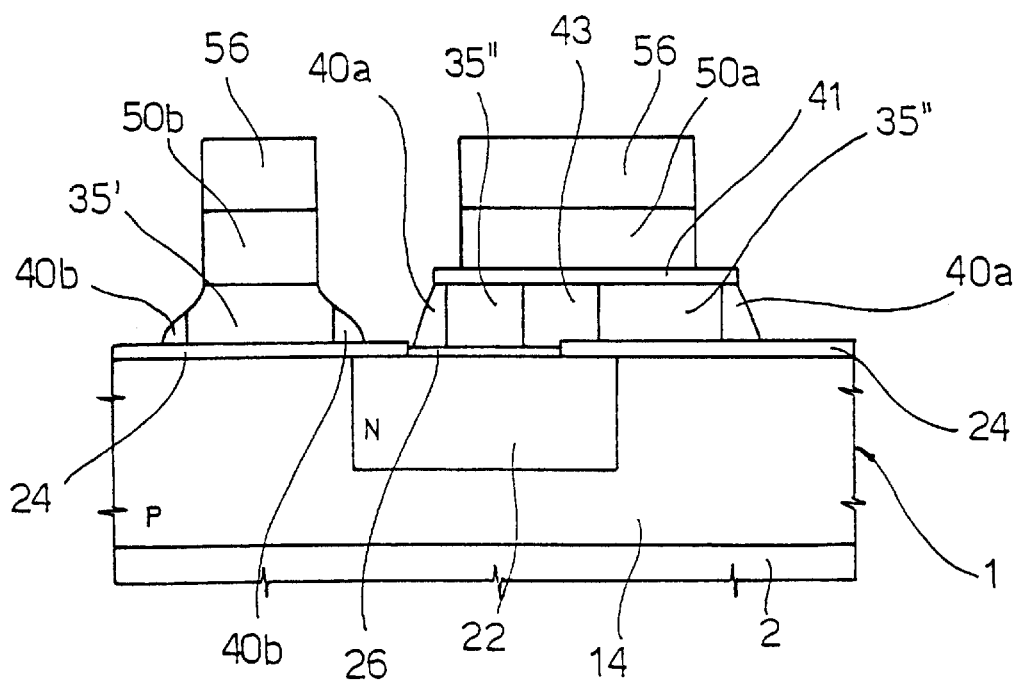
FIG. 14 shows a cross-sectional view similar to that of FIG. 12, in a subsequent manufacturing step.
Figure 15:
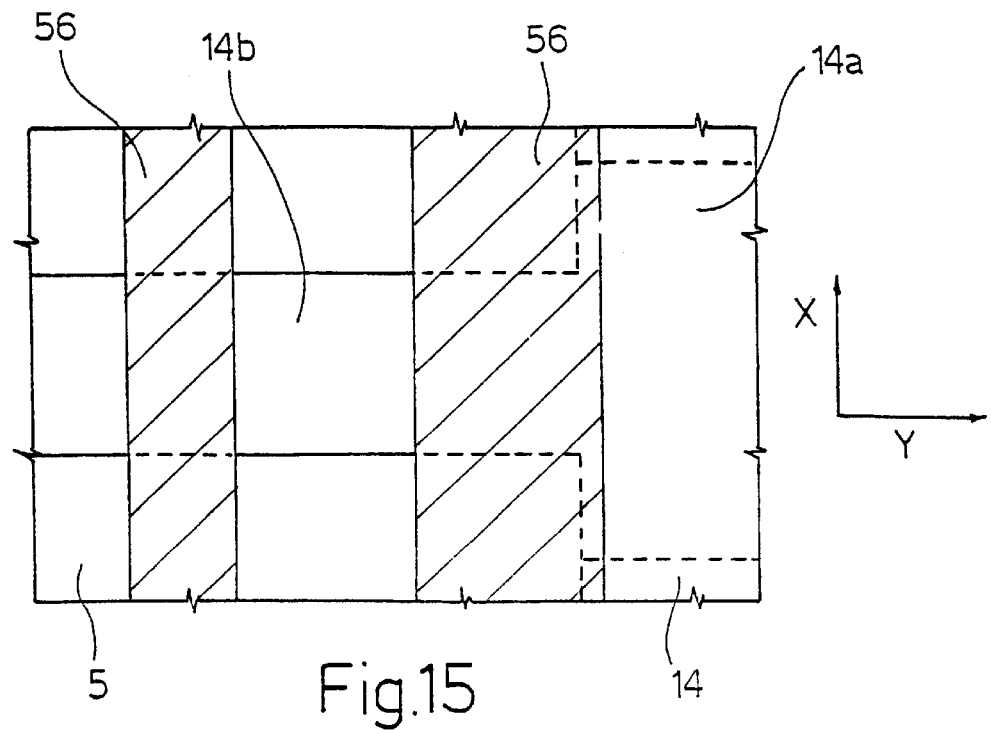
FIG. 15 presents a top view of the wafer of FIG. 14.

The etch used to shape the second polysilicon layer proceeds in a self aligned manner also along the lower gate portion 35' of the selection transistor, partially removing the lateral protection regions 40b and the lower gate portion 35', as shown in FIG. 14.

The previous surface planarization of the floating gate region 35", and of the lower gate portion 35' enables the second polycrystalline silicon layer to be deposited on a planar surface both on the floating gate region 35" and on the lower gate portion 35', so as to ensure better electrical characteristics.

In this way, the gate region of the selection transistor is formed by two polysilicon regions, 35' and 50b.

Figure 16:
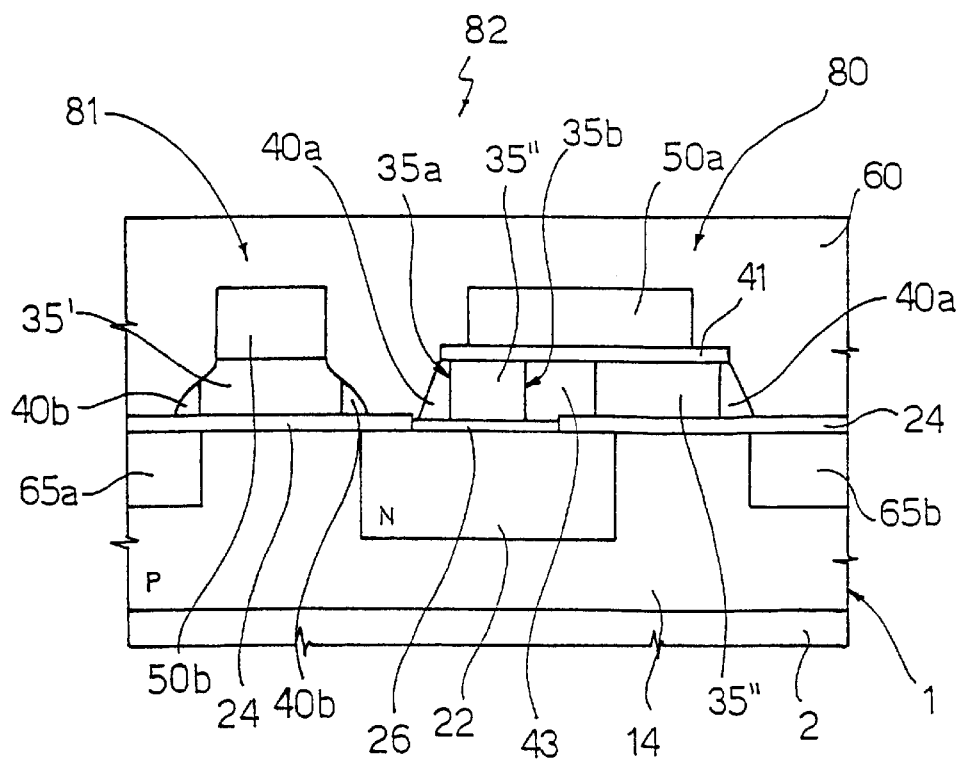
FIG. 16 shows a cross-sectional view similar to that of FIG. 14, in a final step of the process according to the present invention.

Then, further final steps are carried out (FIG. 16) that comprise depositing an insulating dielectric material layer 60, forming a conductive source region 65a and a conductive drain region 65b in the active area 14, and forming electrical connections. A memory cell 82 is thus obtained, comprising a memory transistor 80 and a selection transistor 81 (FIG. 16).

The described method thus allows the dimensions of the tunnel area to be controlled with a precision that depends solely upon the dimensional control of the active area mask 4 (in the x direction) and of the floating gate mask 30 (in the y direction) and not upon the misalignments between the masks, which are much less controllable; at the same time, the described method does not present the critical aspects of the previous process.

Since the gate region of the selection transistor 81 includes two polysilicon layers, the upper gate portion 50b and the control gate region 50a may be formed at the same height.

In addition, the planarization step carried out to remove the dielectric material layer 40 above the floating gate region 35" and the lower gate portion 35' of the selection transistor 81 bestows more uniform electrical characteristics on the memory cells 82.

The filling region 43 of dielectric material moreover ensures complete sealing of the floating gate region 35", thereby resulting in a greater reliability of the cell 82.

The presence of the hole 37 in the floating gate region 35" requires appropriate resizing of the cell; in fact, the area of the floating gate region 35" of the selection transistor 82 is reduced. Consequently, the present memory cell may be advantageously applied in applications where the requisites of area occupied are less stringent (for example, but not only, in "embedded" applications), and where it is necessary to have high electrical characteristics and high characteristics of reliability.

In addition, the process according to the invention optimizes the number of required steps, using, on the whole, a low number of masks. In particular, a single insulating material layer 24 forms both the gate oxide of the memory transistor 80 and the gate oxide of the selection transistor 81, thus avoiding the use of two different oxides, as in the case of the aforementioned process.

Finally, it is clear that numerous modifications and variations can be formed to the method and to the electronic device described and illustrated herein, all of which falling within the scope of the invention, as defined in the attached claims and the equivalents thereof. For example, instead of being completely inside the floating gate region 35", the hole 37 may face one side of the latter, perpendicularly to the side 35b, and instead of being completely filled with dielectric material, it may be just coated with dielectric material.

The described process is compatible with circuitry transistors formed using different techniques, in particular with transistors formed (as in the case of the selection transistor 81) with a double polycrystalline silicon layer, of the non-aligned DPCC (short-circuited double poly) type, in a non-dual gate process.

What is claimed is:

1. A process for manufacturing an electronic device including a memory cell of the EEPROM type having a memory transistor and a selection transistor, the process comprising:

forming a first dielectric material layer on top of a semiconductor material substrate, said first dielectric material layer comprising a tunnel area;

simultaneously forming a floating gate region of said memory transistor on top of said first dielectric material layer, said floating gate region partially overlying said tunnel area, and a lower gate portion on top of said first dielectric material layer in a position adjacent to and at a distance from said floating gate region, comprising depositing a first semiconductor material layer above said first dielectric material layer and said tunnel area and selectively removing said first semiconductor material layer, including removing said first semiconductor material layer externally to said floating gate region and said lower gate portion and inside said floating gate region, forming a hole in said floating gate region;

forming an insulating structure surrounding said floating gate region, including coating said hole with an insulating material;

simultaneously forming a control gate region on top of said insulating structure and an upper gate portion on top of said lower gate portion; and forming conductive regions in said semiconductor material substrate.

2. The process of claim 1, further comprising filling said hole with electrically insulating material before forming an insulating structure.

3. The process of claim 2 wherein filling said hole comprises depositing a second dielectric material layer, said second dielectric material layer comprising a filling region extending in said hole of said floating gate region.

4. The process of claim 3, further comprising, after depositing a second dielectric material layer, planarizing and removing said second dielectric material layer from a top surface of said floating gate region of said memory transistor and said lower gate portion of said selection transistor.

5. The process of claim 4 wherein planarizing and removing is carried out by CMP.

6. The process of claim 5, further comprising, after planarizing and removing step, depositing a third dielectric material layer and selectively removing said third dielectric material layer to form an insulating region on said top surface of said floating gate region.

7. The process of claim 6 wherein said third dielectric material layer comprises ONO.

8. The process of claim 6, further comprising, after selectively removing said third dielectric material layer, anisotropically etching said second dielectric material layer to form spacers at the sides of said floating gate region and said lower gate portion.

9. The process of claim 1 wherein forming a floating gate region uses a floating gate mask having an external perimetral edge of rectangular shape defining an external delimiting side and having an opening, and wherein said opening has an internal perimetral edge of rectangular shape defining an internal delimiting side, said external delimiting side and said internal delimiting side being parallel, facing each other and delimiting between each other a mask portion of preset length.

10. The process of claim 9 wherein said mask portion is inside said tunnel area at least in the direction of said preset length.

11. The process of claim 1 wherein forming a first dielectric material layer comprises growing a first silicon oxide layer; selectively removing said first silicon oxide layer in said tunnel area; and growing a second silicon oxide layer, said first silicon oxide layer having a greater thickness than said second silicon oxide layer.

12. A process for manufacturing an integrated circuit, comprising:

deposing a first semiconductor material layer above a first dielectric material layer having a tunnel area;

selectively removing the first semiconductor material layer to form a lower gate region and a floating gate region, with the floating gate region having a hole formed therein;

depositing a dielectric material that fills the hole and forms an insulating structure around the floating gate region; and simultaneously forming a control gate region above the floating gate region and forming an upper gate portion above the lower gate portion, with the control gate region and the upper gate portion formed at substantially the same level.

13. The process of claim 12 wherein forming the floating gate region and the lower gate portion comprises forming the floating gate region to partially overlie the tunnel area and forming the lower gate portion in a position adjacent to and at a distance from the floating gate region.

14. The process of claim 12 wherein depositing a dielectric material comprises depositing a second dielectric material layer, the second dielectric material layer comprising a filling region extending in the hole of the floating gate region.

15. The process of claim 14 further comprising planarizing and removing the second dielectric material layer.

16. The process of claim 15 further comprising depositing a third dielectric material layer and selectively removing the third dielectric material layer and then anisotropically etching the second dielectric material layer to form spacers at the sides of the floating gate region and the lower gate portion.

17. The process of claim 12 wherein selectively removing the first semiconductor material layer comprises initially forming a floating gate mask having an external perimeter edge of rectangular shape defining an external limiting side and further having an opening with an internal perimetral edge of rectangular shape defining an internal delimiting side, the external delimiting side and the internal delimiting side being parallel and facing each other and delimiting between each other a mask portion.

18. A manufacturing process, comprising:

forming a substrate and an insulating layer, including a tunnel area;

simultaneously forming a floating gate region of a memory transistor and a lower gate portion of a selection transistor, the floating gate region internally forming a hole, one side of which delimits, together with an external side of the floating gate region, a portion of a tunnel arranged above the tunnel area;

depositing a dielectric material layer that fills the hole of the floating gate region; and forming a control gate region above the floating gate region and simultaneously forming an upper gate portion above the lower gate portion.

19. The manufacturing process of claim 18 further comprising, before forming the control gate region and the upper gate portion, planarizing the dielectric material to form an insulating region of dielectric material around the floating gate region.

* * * * *